United States Patent
Yenson et al.

(10) Patent No.: US 8,442,352 B2
(45) Date of Patent: May 14, 2013

(54) METHOD FOR GENERATING ALIGNMENT MARKS

(75) Inventors: Brendon Yenson, Connells Point (AU); Scott Alexander Rudkin, Chatswood (AU)

(73) Assignee: Canon Kabushiki Kaisha, Tokyo (JP)

( * ) Notice: Subject to any disclaimer, the term of this patent is extended or adjusted under 35 U.S.C. 154(b) by 847 days.

(21) Appl. No.: 12/619,951

(22) Filed: Nov. 17, 2009

(65) Prior Publication Data

US 2010/0149555 A1    Jun. 17, 2010

(51) Int. Cl.
    *G06K 9/00*        (2006.01)
(52) U.S. Cl.
    USPC ........... 382/278; 382/112; 382/141; 382/181; 382/209; 382/216; 382/276; 382/280; 382/287; 382/294
(58) Field of Classification Search ............... 382/100, 382/112, 141–145, 181, 209, 216, 276, 278, 382/280, 294–29
    See application file for complete search history.

(56) References Cited

U.S. PATENT DOCUMENTS

| | | | |
|---|---|---|---|
| 5,534,895 A | 7/1996 | Lindenfelser et al. | |
| 6,010,205 A | 1/2000 | Billet | |
| 7,031,493 B2 * | 4/2006 | Fletcher et al. | 382/100 |
| 7,073,883 B2 | 7/2006 | Billow | |
| 7,246,871 B2 | 7/2007 | Silverbrook | |
| 7,471,807 B2 * | 12/2008 | Asano et al. | 382/100 |
| 7,991,186 B2 * | 8/2011 | Rudaz et al. | 382/100 |
| 2005/0083364 A1 | 4/2005 | Billow | |
| 2006/0055720 A1 | 3/2006 | Olson et al. | |
| 2008/0130945 A1 * | 6/2008 | Rhoads et al. | 382/100 |
| 2009/0021551 A1 | 1/2009 | Fletcher et al. | |

* cited by examiner

*Primary Examiner* — Wesley Tucker
(74) *Attorney, Agent, or Firm* — Fitzpatrick, Cella, Harper & Scinto

(57) ABSTRACT

A method (100), an apparatus (1100), and a computer program product are disclosed for generating alignment marks. A basis pattern (120) and a high frequency component (130) are combined (140). The basis pattern is defined such that a scaled and rotated version of the basis pattern correlated with the basis pattern is substantially equal to the auto-correlation of the basis pattern within a complex multiplicative constant. The high frequency component is of sufficient energy for cross correlation without detriment to the basis pattern. The basis pattern may be generated from a basis function, which may be a logarithmic radial harmonic function (LRHF). The combination is output as at least one alignment mark having an increased maximum frequency. The method (100) may further comprise printing the at least one alignment mark on a print medium.

20 Claims, 13 Drawing Sheets

METHOD FOR GENERATING ALIGNMENT MARKS

RELATED APPLICATION

The present application claims under 35 USC 119 the benefit of the earlier filing date of Australian Patent Application No. 2008258153 filed on 16 Dec. 2008, of which the entire contents are hereby incorporated by reference.

TECHNICAL FIELD

The present invention relates generally to the generation and detection of patterns in images, documents, and/or surfaces for alignment information. In particular, the present invention relates to patterns that have scale and rotation invariant properties.

BACKGROUND

Precise alignment of images is important in a number of endeavours, including the calibration of colour registration in printing processes and mask alignment during manufacture of electronic circuits and circuit boards. One method of achieving alignment is to include one or more alignment marks on the target substrate and exploit the properties of these marks to determine pre-defined locations in an image. Examples of alignment marks include dots, lines, and/or cross patterns.

One method for detecting patterns, such as alignment marks, is cross correlation. For linear systems, correlation, or matched filtering, can be shown to be mathematically an optimal detection method. Correlation in two dimensions is not generally invariant with orientation or scaling. An existing method of generating orientation and scale invariant alignment marks provides limited accuracy due to the frequency response of the alignment marks, where energy is concentrated at low frequencies.

SUMMARY

In accordance with an aspect of the invention, there is provided a method of generating alignment marks. The method comprises the steps of combining a basis pattern and a high frequency component, the basis pattern being defined such that a scaled and rotated version of the basis pattern correlated with the basis pattern is substantially equal to the auto-correlation of the basis pattern within a complex multiplicative constant, the high frequency component being of sufficient energy for cross correlation without detriment to the basis pattern; and outputting the combination as at least one alignment mark having an increased maximum frequency.

The basis pattern may be a tile comprising a plurality of pixels, and the high frequency component is a tile comprising a plurality of pixels.

The at least one alignment mark may have an increased frequency without the size of a hole in the centre of the basis pattern decreasing.

The method may further comprise printing the at least one alignment mark on a print medium.

The method may further comprise the steps of generating a basis function; and generating the basis pattern from the basis function.

The basis function may be a logarithmic radial harmonic function (LRHF). The basis pattern may be generated by using only the real part or only the imaginary part of the LRHF.

The method may further comprise the step of generating the high frequency component. The generating step may comprise: creating a tile comprising a plurality of pixels having uniformly distributed noise values without periodic patterns; and creating a tile comprising a plurality of pixels having a constant density of values for a desired density of the high frequency component. The tile having uniformly distributed noise values without periodic patterns may be created by multiplying by a perturbation factor a tile comprising a plurality of pixels having uniformly distributed noise values to provide the tile having uniformly distributed noise values without periodic patterns having an average density close to the desired density of the high frequency component.

The combining step may comprise: adding the basis pattern and the high frequency component together, each being a tile comprising a plurality of pixels arranged in two dimensions; and quantising values of the addition tile resulting from the adding step to provide binary values, each binary value indicating if a pixel is to be rendered with a colourant or if the pixel is empty.

The combining step may comprise: quantising real values of the high frequency component, the high frequency component being a tile comprising a plurality of pixels arranged in two dimensions; quantising values of the basis pattern to provide binary values; and using a logical AND operation to combine the quantised high frequency component and the quantised basis pattern. The high frequency component may have a density of values that is twice a desired density of the alignment mark and the binarised basis pattern may be adapted to reduce the density of the high frequency component when combined with the high frequency component.

The combining step may comprise: quantising real values of the high frequency component, the high frequency component being a tile comprising a plurality of pixels arranged in two dimensions; quantising values of the basis pattern to provide binary values, the basis pattern being a tile comprising a plurality of pixels arranged in two dimensions; and adding together the quantised high frequency component and the quantised basis pattern, the quantised high frequency component being adapted to be contained in the Nyquist hole in the centre of the basis pattern as a result of the adding step.

The combining step may further comprise removing at least one quantised value of a pixel from the tile of quantised values, the removed value of the pixel being incompatible with rendering of the at least one alignment mark onto a print medium.

The combining step may further comprise windowing the tile of quantised values to reduce the size of the tile.

The quantising step may use a half toning algorithm.

The method may further comprise the step of applying a pseudo-random mask to a basis function to provide the basis pattern.

In accordance with another aspect of the invention, there is provided a method of printing a chart for measuring characteristics of a print medium feed mechanism of a printer. The method comprises the steps of: printing on a print medium in a first passage across the print medium at least two alignment marks, each alignment mark printed in the first passage generated in accordance with the method according to any one of the foregoing aspects; displacing the print medium in a feed direction using the print medium feed mechanism; and printing on a print medium in a second passage across the print medium at least one alignment mark, each alignment mark printed in the second passage generated in accordance with the method according to any of the foregoing aspects.

In accordance with another aspect of the invention, there is provided a computer program product comprising a tangible computer readable medium having a computer program recorded thereon for execution by a computer to perform the method according to any one of the foregoing aspects.

In accordance with still another aspect of the invention, there is provided a method of measuring the linefeed characteristic of a printer. The method comprises the steps of: imaging a chart printed using the printer in accordance with the method according to the foregoing aspect; calculating locations of the alignment marks in the image of the printed chart; calculating relative displacements between pairs of the alignment marks in the image of the printed chart; and calculating the linefeed characteristic of the printer dependent upon the calculated relative displacements.

In accordance with yet another aspect of the invention, there is provided a apparatus for generating alignment marks, comprising: a memory for storing data and instructions for a central processing unit; and a central processing unit coupled to the memory, the central processing unit performing the method according to the method of generating alignment marks dependent upon the instructions and the data to generate the alignment marks.

In accordance with a further aspect of the invention, there is provided a apparatus for printing a chart for measuring characteristics of a printing apparatus, comprising: at least one print head for printing on a print medium; a print medium feed mechanism for displacing the print medium; and an apparatus for generating alignment marks in accordance with the foregoing aspect of the invention.

In accordance with still a further aspect of the invention, there is provided a system for measuring the linefeed characteristic of a printing apparatus, the system comprising: an apparatus for printing a chart for measuring characteristics the printing apparatus in accordance with the foregoing aspect of the invention; an imaging device for generating an image of the printed chart; a module for calculating locations of alignment marks in the image of the printed chart; a module for calculating relative displacements between pairs of the alignment marks in the image of the printed chart; and a module for calculating the linefeed characteristic of the printer dependent upon the calculated relative displacements.

BRIEF DESCRIPTION OF THE DRAWINGS

Embodiments of the invention are described with reference to the drawings, in which.

DETAILED DESCRIPTION

Figure 1:
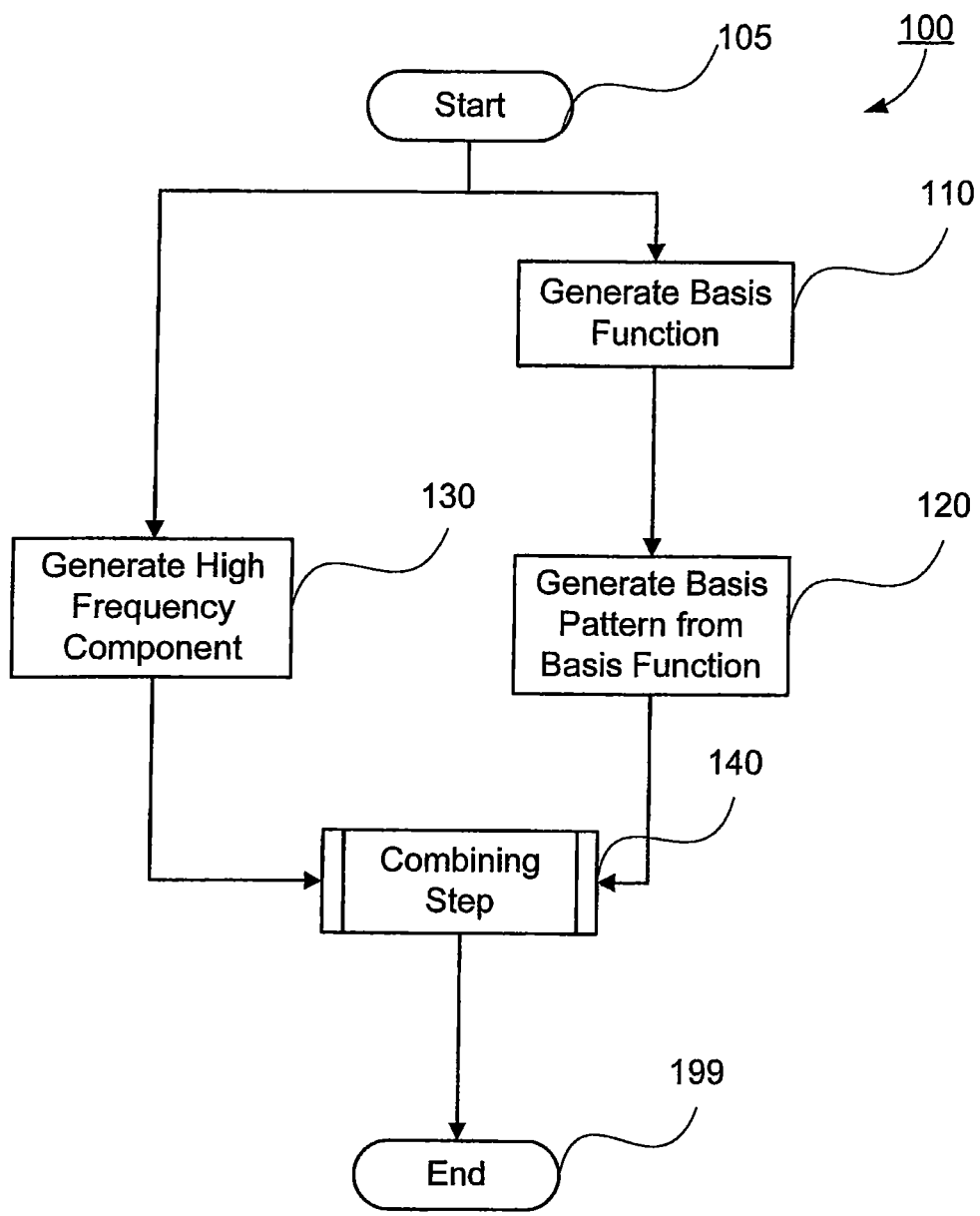
FIG. 1 is a flow diagram illustrating a method of increasing the maximum frequency of an alignment mark according to an embodiment of the invention.

Methods, apparatuses, systems and computer program products are disclosed for generating alignment marks. Methods, apparatuses, systems and computer program products are also disclosed for printing a chart for measuring characteristics of a print medium feed mechanism of a printer. Methods, apparatuses, systems and computer program products are also disclosed for measuring the linefeed characteristic of a printer. In the following description, numerous specific details, including particular scanning resolutions, particular media, imaging techniques and the like are set forth. However, from this disclosure, it will be apparent to those skilled in the art that modifications and/or substitutions may be made without departing from the scope and spirit of the invention. In other circumstances, specific details may be omitted so as not to obscure the invention.

Where reference is made in any one or more of the accompanying drawings to steps and/or features, which have the same reference numerals, those steps and/or features have for the purposes of this description the same function(s) or operation(s), unless the contrary intention appears.

A set of functions for use as the basis for the design of alignment marks is described. A method of improving the detection accuracy of such alignment marks is explained, along with a number of sample embodiments. Finally, an example application of such improved alignment marks is described.

The embodiments of the invention described hereinafter with reference to FIGS. 1-16 may be implemented using a computer system 1200, such as that shown in FIG. 12, in which the processes of FIGS. 1, 7-10, and 15 may be implemented as software, such as one or more application programs executable within the computer system 1200. In particular, the steps of the methods shown in FIGS. 1, 7-10, and 15 are effected by instructions in the software that are carried out within the computer system 1200. The instructions may be formed as one or more code modules, each for performing one or more particular tasks. The software may also be divided into two separate parts, in which a first part and the corresponding code modules performs the methods for generating an alignment mark, for printing a chart for measuring characteristics of a print medium feed mechanism of a printer, and for measuring the linefeed characteristic of a printer, and a second part and the corresponding code modules manage a user interface between the first part and the user. The software may be stored in a computer readable medium, including the storage devices described hereinafter, for example. The software is loaded into the computer system 1200 from the computer readable medium, and then executed by the computer system 1200. A computer readable medium having such software or computer program recorded on the computer readable medium is a computer program product. The use of the computer program product in the computer system 1200 preferably effects an advantageous apparatus for performing methods in accordance with the embodiments of the invention.

Figure 11:
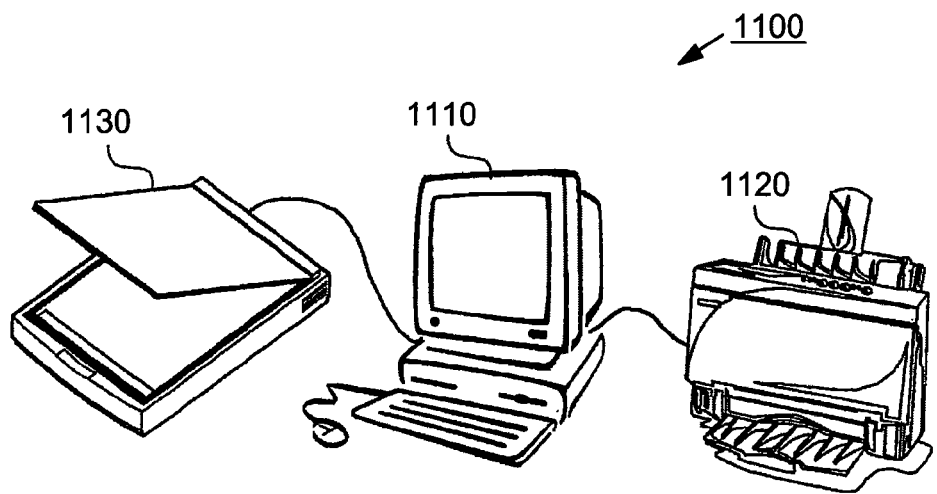
FIG. 11 is a block diagram illustrating an arrangement for measuring the linefeed of an Inkjet Printer.
Figure 12:
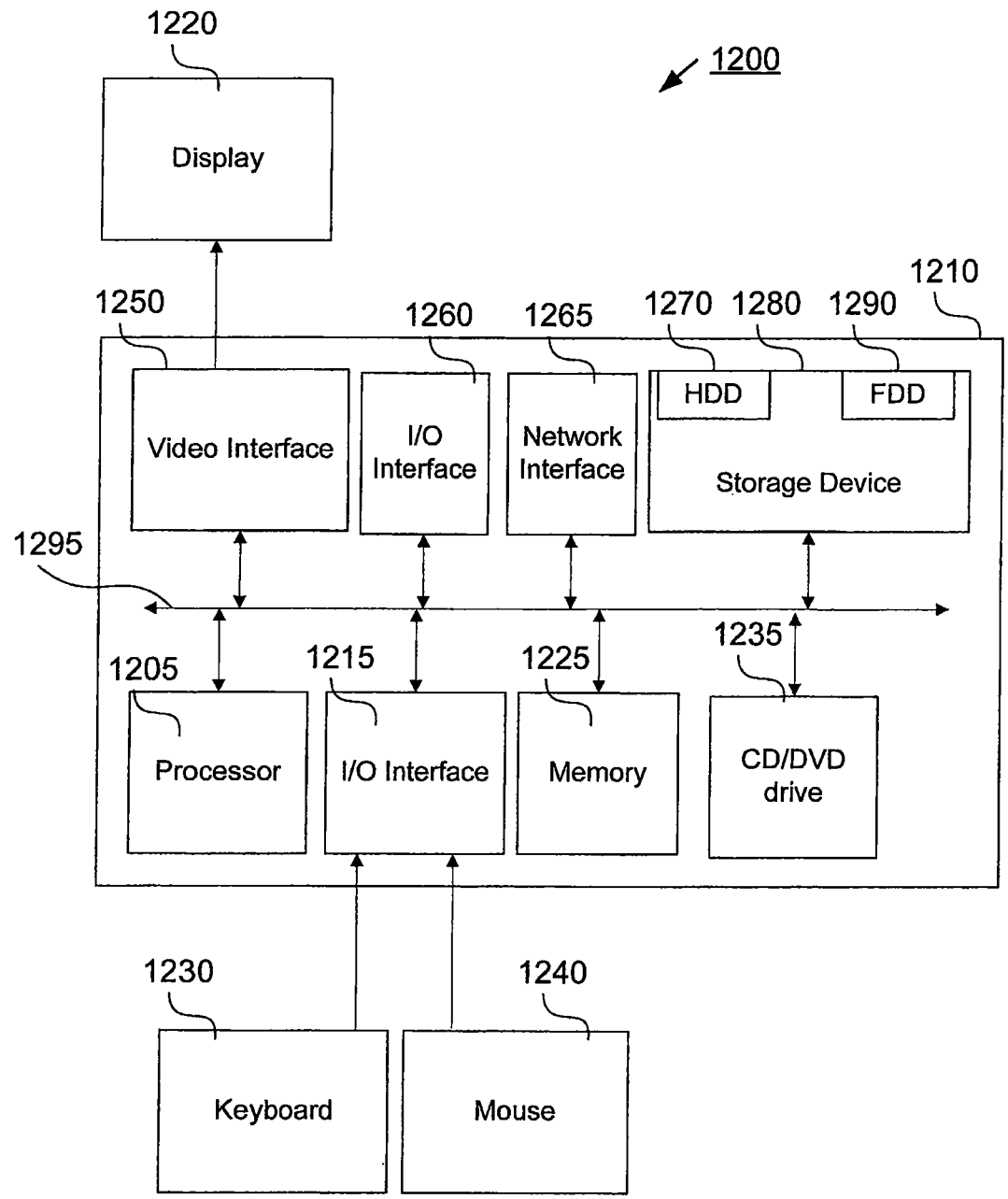
FIG. 12 is a schematic block diagram of a general purpose computer with which the embodiments of the invention can be practiced.

FIG. 12 shows a schematic block diagram of the general-purpose computer 1110 of FIG. 11 (described hereinafter). The computer 1110 comprises a computer module 1210, input devices such as a keyboard 1230 and mouse 1240, and a display device 1220. The computer module 1210 typically includes at least one processor unit 1205, and a memory unit 1225. The module 1210 also includes a number of input/output (I/O) interfaces including a video interface 1250 that couples to the display device 1220, an I/O interface 1215 for the keyboard 1230 and mouse 1240, and an interface 1260 for interfacing with devices external to the computer module 1210 (not shown), such as the digital scanner 1130 of FIG. 11.

A storage device 1280 is provided and typically includes a hard disk drive (HDD) 1270 and a floppy disk drive (FDD) 1290. A CD and/or DVD drive 1235 is typically provided as another source of data or mechanism to store data externally to the computer. Optionally, at least one network interface 1265 may be provided to allow a computer to send and/or receive data to another computer or network of computers. The components 1205, 1215, 1225, 1235, 1250, 1260, 1265, 1270, 1280 and 1290 of the computer module 1210 typically communicate via an interconnected bus 1295 and in a manner which results in a conventional mode of operation of the computer system 1210 known to those in the relevant art.

The network may be a wide-area network (WAN), such as the Internet or a private WAN. Where the connection is a telephone line, a traditional "dial-up" modem may be used. Alternatively, where the connection is a high capacity (eg: cable) connection, the modem may be a broadband modem. A wireless modem may also be used for wireless connection to the network.

The components of the computer module 1210 typically communicate via an interconnected bus 1295 and in a manner which results in a conventional mode of operation of the computer system 1200 known to those in the relevant art. Examples of computers on which the described arrangements can be practised include IBM-PC's and compatibles, Sun Sparcstations, Apple Mac™ or alike computer systems evolved therefrom.

Typically, the application programs discussed hereinbefore are resident on the hard disk drive 1270 and read and controlled in execution by the processor 1205. Intermediate storage of such programs and any data fetched from the networks and may be accomplished using the semiconductor memory 1225, possibly in concert with the hard disk drive 1270. In some instances, the application programs may be supplied to the user encoded on one or more CD-ROM and read via the corresponding drive 1235, or alternatively may be read by the user from the networks. Still further, the software can also be loaded into the computer system 1200 from other computer readable media. Computer readable media refers to any storage medium that participates in providing instructions and/or data to the computer system 1200 for execution and/or processing. Examples of such media include floppy disks, magnetic tape, CD-ROM, a hard disk drive, a ROM or integrated circuit, a magneto-optical disk, or a computer readable card such as a PCMCIA card and the like, whether or not such devices are internal or external of the computer module 1210. Examples of computer readable transmission media that may also participate in the provision of instructions and/or data include radio or infra-red transmission channels as well as a network connection to another computer or networked device, and the Internet or Intranets including e-mail transmissions and information recorded on Websites and the like.

The second part of the application programs and the corresponding code modules mentioned hereinbefore may be executed to implement one or more graphical user interfaces (GUIs) to be rendered or otherwise represented upon the display 1220. Through manipulation of the keyboard 1230 and the mouse 1240, a user of the computer system 1200 and the application may manipulate the interface to provide controlling commands and/or input to the applications associated with the GUI(s).

The method of FIGS. 1, 7-10, and 15 may alternatively be implemented in dedicated hardware such as one or more integrated circuits performing the functions or sub functions of the methods in accordance with the embodiments of the invention. Such dedicated hardware may include graphic processors, digital signal processors, or one or more microprocessors and associated memories. The method of FIGS. 1, 7-10, and 15 are described in greater detail hereinafter.

Certain functions have a scale invariant property, whereby a change of scale in the coordinate results in a transformed function that is the same as the original function, apart from a multiplicative constant. These functions are sometimes referred to as homogeneous functions. Consider a homogeneous function:

$$f(r) = \cos[\alpha \ln(r)] \quad (1)$$

having a logarithmic phase as follows:

$$\psi(r) = \alpha \ln(r) \quad (2)$$

Such a phase has a frequency of $$\frac{d\psi}{dr} = \frac{\alpha}{r}.$$

The function f(r) has the useful scaling property, in that:

$$f(ar) = \cos[\alpha \ln(ar)] = \cos[\alpha \ln(r) + \alpha \ln(a)] \quad (3)$$

Figure 3:
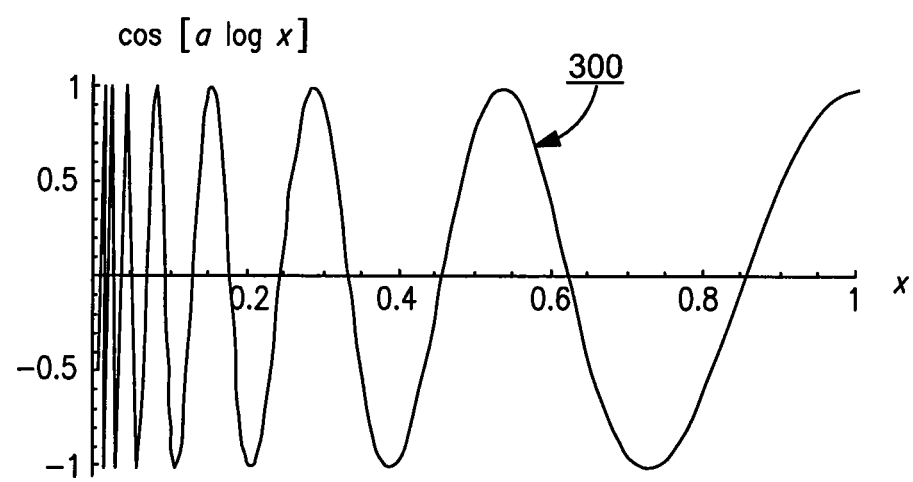
FIG. 3 is a plot showing a section of the function defined in FIG. 2.

In other words, a coordinate scale change only produces a fixed phase change in the cosine. The function in Equation (1) has some peculiar properties, such as an infinite number of periods in the range $0 \leq r < \epsilon$, and the phase approaches $-\infty$ as the radius tends to zero. The undesired effects of these properties can be largely avoided by removal of a central region below a threshold radius. FIG. 3 shows a one-dimensional example of a simple oscillating homogeneous function having the form of Equation (1), for values $0.01 \leq x \leq 1$.

The homogeneity condition can also be viewed as a self-similarity criterion. Self-similar functions produce correlation magnitude peaks even when one of the correlated functions is rescaled. A complex function with the self-similarity property is:

$$f_\alpha(r) = r^p \exp[i\alpha \ln(r)] \quad (4)$$

A scale change provides:

$$f_\alpha(ar) = a^p r^p \exp[i\alpha \ln(r)] \exp[i\alpha \ln(a)] = a^p \exp[i\alpha \ln(a)]$$
$$f_\alpha(r), \quad (5)$$

which introduces a magnitude and phase change. By using a complex exponent:

$$\exp[i\alpha \ln(r)] = r^{i\alpha} \quad (6)$$

Equation (4) can be written as:

$$f_\alpha(r) = r^p r^{i\alpha} \tag{7}$$

Equation (7) represents a family of functions, which have a periodic radial structure. Functions of the form of Equation (7) have some useful orthogonality properties over an annular region, with the annular region defined by a maximum radius $R_2$ and the minimum radius $R_1$. Consider the radial function:

$$f_m(r) = r^p r^{i\alpha_m} \tag{8}$$

The correlation at the origin, or zero shift, is defined by an overlap integral $I_{mn}$ of this function $f_m(r)$ with another similar function $f_n(r)$ with parameter $\alpha_n$ instead of parameter $\alpha_m$, and can be written in polar coordinates as:

$$I_{mn} = \int_{R_1}^{R_2} 2\pi r f_m(r) f_n^*(r) \, dr = \frac{2\pi \left( R_2^{2p+2} R_2^{i(\alpha_m-\alpha_n)} - R_1^{2p+2} R_1^{i(\alpha_m-\alpha_n)} \right)}{2p + 2 + i(\alpha_m - \alpha_n)} \tag{9}$$

From Equation (9), it can be seen that a prerequisite of orthogonality of the functions $f_m(r)$ and $f_n(r)$, is that $p=-1$. For one-dimensional functions, the orthogonality prerequisite is $p=-\frac{1}{2}$.

Generally, the magnitude squared of the overlap integral $|I_{mn}|^2$ may be written as a sinc function as follows:

$$|I_{mn}|^2 = \frac{(4\pi)^2 \sin^2\left( \frac{1}{2} [\alpha_m - \alpha_n] \ln\left[ \frac{R_2}{R_1} \right] \right)}{(\alpha_m - \alpha_n)^2} \tag{10}$$

The magnitude of the overlap integral $|I_{mn}|$ is a maximum as the parameters $\alpha_n$ and $\alpha_m$ approach $\alpha_m - \alpha_n = 0$, and zero when $$\alpha_m - \alpha_n = \frac{2\pi j}{\ln\left[\frac{R_2}{R_1}\right]}, \tag{11}$$

$$j = \text{integer, but } j \neq 0$$

In practice, the magnitude of the overlap integral $|I_{mn}|$ is small or negligible when $$|\alpha_m - \alpha_n| > \frac{2\pi}{\ln\left[\frac{R_2}{R_1}\right]} \tag{12}$$

The above condition is an approximate orthogonality condition, useful for estimation purposes. In practice the ratio $R_2/R_1$ is chosen to be of the order 2 to 4, so that $\ln(R_2/R_1) \approx 1$.

By including a spiral phase function in Equation (8), thereby causing polar angle $\theta = \tan^{-1}[y/x]$ variations in the pattern function, the pattern function retains its scale invariant and orthogonality properties. Consider a scale and rotation invariant pattern g, which has a circular harmonic phase defined by the parameter k, where parameter k is an integer. Such a function is sometimes referred to as a logarithmic radial harmonic function [LRHF], and has the form:

$$g_{mk}(r,\theta) = r^p r^{j\alpha_m} e^{jk\theta} \tag{13}$$

The overlap integral $I_{mknl}$ of this LRHF $g_{mk}(r,\theta)$ with another similar LRHF $g_{nl}(r,\theta)$ with parameters $a_n$ and k, over an annular region, is:

$$I_{mknl} = \int_{-\pi}^{\pi} \int_{R_1}^{R_2} 2\pi r g_{mk}(r) g_{nl}^*(r) \, dr \, d\theta = 2\pi \int_{-\pi}^{\pi} e^{i(k-l)\theta} d\theta \int_{R_1}^{R_2} r^{2p+1} r^{i(\alpha_m - \alpha_n)} dr \tag{14}$$

As is evident from Equation (14), the overlap integral $I_{mknl}$ is simple to calculate because of the radial/tangential separability. Equation (14) can be further simplified because the tangential component integrates to a Kronecker delta function as follows:

$$\int_{-\pi}^{\pi} e^{i(k-l)\theta} d\theta = 2\pi \delta_{kl} = \begin{cases} 2\pi, & k = l \\ 0, & k \neq l \end{cases} \tag{15}$$

causing the overlap integral $I_{mknl}$ to simplify to $$I_{mknl} = (2\pi)^2 \frac{\delta_{k1} \left( R_2^{2P+2} R_2^{i(\alpha_m - \alpha_n)} - R_1^{2P+2} R_1^{i(\alpha_m - \alpha_n)} \right)}{2p + 2 + i(\alpha_m - \alpha_n)} \tag{16}$$

Again, at orthogonality where $p=-1$, the magnitude squared of the overlap integral is:

$$|I_{mknl}|^2 = (4\pi)^2 \delta_{k1} \frac{\sin^2\left(\frac{1}{2}[\alpha_m - \alpha_n] \ln\left[\frac{R_2}{R_1}\right]\right)}{(\alpha_m - \alpha_n)^2} \tag{17}$$

The preceding analysis refers to complex exponential functions, but in practice, images are limited to real, as well as positive, reflectivity, transmissivity, or intensity values. If the overlap integral $I_{mknl}$ is calculated for the real part of one LRHF $g_{mk}$ with a full complex LRHF $g_{nl}$, a magnitude squared of the overlap integral $|I_{mknl}|^2$ would be obtained that is similar to Equation (17), but reduced by a factor of four.

Therefore, the LRHF $g_{mk}$ is defined by the real value m and integer parameter k, where real value m defines in the parameter $\alpha_m$ as:

$$\alpha_m = \frac{2\pi m}{\ln\left[\frac{R_2}{R_1}\right]} \tag{18}$$

In a typical application the LRHF $g_{mk}$ is evaluated over a discrete image with a finite size, and where the pixel positions (x, y) only contain discrete integer values. To avoid aliasing, constraints are imposed on the allowable values for the parameters k and $\alpha_m$.

The LRHF $g_{mk}$ has a well defined local frequency q(x,y), which is defined as the modulus of the gradient of the phase $\Psi_{mk}$ of the LRHF $g_{mk}(r)$, so $$2\pi q(x,y) = \sqrt{\left(\frac{\partial \Psi_{mk}}{\partial x}\right)^2 + \left(\frac{\partial \Psi_{mk}}{\partial y}\right)^2} \tag{19}$$

where $$g_{mk} = |g_{mk}| \exp(i\psi_{mk}) \tag{20}$$

Hence, from Equation (13), the phase $\Psi_{mk}$ is $$\Psi_{mk} = \alpha_m \ln r + k\theta \qquad (21)$$

$$\frac{\partial \Psi_{mk}}{\partial x} = \frac{\alpha_m}{r}\frac{dr}{dx} + k\frac{d\theta}{dx} = \frac{x\alpha_m - ky}{r^2} \qquad (22)$$

$$\frac{\partial \Psi_{mk}}{\partial y} = \frac{\alpha_m}{r}\frac{dr}{dx} + k\frac{d\theta}{dx} = \frac{y\alpha_m + kx}{r^2} \qquad (23)$$

Substituting Equations (22) and (23) into Equation (19), local frequency q(x,y) is:

$$q(x, y) = \frac{\sqrt{\alpha_m^2 + k^2}}{2\pi r} \qquad (24)$$

In other words, the radial and tangential frequencies are square additives. In fact the full 2D frequency is the vector sum of the radial and tangential frequency vectors. The orientation of the local frequency q(x,y) is always fixed relative to the polar angle θ:

$$\tan\left[\frac{\partial \psi_{mk}}{\partial y} \Big/ \frac{\partial \psi_{mk}}{\partial x}\right] = \tan\left[\frac{y\alpha_m + kx}{x\alpha_m - ky}\right] = \tan[\chi + \theta] \qquad (25)$$

where $$\tan[\chi] = \frac{k}{\alpha_m}, \tan[\theta] = \frac{y}{x} \qquad (26)$$

This property means that spirals in the LRHF $g_{mk}$ are equiangular.

The minimum frequency $q_{min}$ for an annular LRHF $g_{mk}$ occurs at the maximum radius $R_2$ and the maximum frequency $q_{max}$ at the minimum radius $R_1$ defined respectively by:

$$q_{max} = \frac{\sqrt{\alpha_m^2 + k^2}}{2\pi R_1}, q_{min} = \frac{\sqrt{\alpha_m^2 + k^2}}{2\pi R_2} \qquad (27)$$

The maximum frequency $q_{max}$ is kept below the Nyquist frequency of the discrete image.

The foregoing described the basic properties of LRHFs. However, the property of significant interest in this implementation is their correlation property. Correlation at the origin has been dealt with in the overlap integral $I_{mkln}$.

In the more general case of cross-correlation and auto-correlation, a 2D-correlation function is obtained. An efficient method of correlating two large image functions is via the Fast Fourier Transform (FFT).

It is convenient to work with continuous Fourier transforms initially, although much of the mathematics transfers directly to the discrete case with discrete Fourier transforms, with the exception of infinite frequency parts. Consider first the case of purely radial functions with complex exponent c, having the form of Equation (8), and its transform:

$$r^{-c} \Leftrightarrow q^{c-2}2^{1-c}\frac{\Gamma(1-c/2)}{\Gamma(c/2)} \qquad (28)$$

Here Γ( ) is the generalised factorial (gamma) function. Using partial derivatives, LRHFs $g_{mk}$ having the form of Equation (13), have the following transform pair:

$$r^p r^{i\alpha_m} e^{ik\theta} \Leftrightarrow \mu_{mkp} q^{-p-2} q^{-i\alpha_m} e^{ik\phi} \qquad (29)$$

The parameter μ is a complex constant related to the gamma function Γ( ). No coordinate scaling is necessary to estimate the form of the Fourier transform. In fact the Fourier phase φ is essentially the same as the spatial phase θ, except for a sign reversal in the radial component. This can be seen from the following:

$$\arg[r^p r^{i\alpha} e^{in\theta}] = \alpha \ln[r] + n\theta \qquad (30)$$

$$\arg[\mu_{mkp} q^{-p-2} q^{-i\alpha_m} e^{ik\phi}] = \text{const} - \alpha_m \ln[q] + k\phi \qquad (31)$$

One of the principle applications of correlation in image processing is in the area of template matching. Correlation is therefore used to detect the presence of a pattern, such as a LRHF $g_{mk}$, in an image f, where the image $f(x,y)=p(x,y)+g_{nl}(x,y)$. Correlation between pattern $g_{mk}$ and image f produces a 2 dimensional image with maximum values at positions where the image f best matches the pattern $g_{mk}$. The Fourier correlation theorem provides:

$$h(x,y) = f(x,y) \otimes g(x,y) \Leftrightarrow F^*(u,v) \cdot G(u,v) = H(u,v) \qquad (32)$$

Thus, correlation can be implemented by Fourier transforming the image f and the pattern g to obtain Fourier transformed functions F and G, complex conjugating one of the Fourier transformed functions, say F, and then multiplying these two functions F* and G, before transforming back.

It is also noted that:

$$h(x, y) = [p(x, y) + g_{nl}(x, y)] \otimes g_{mk}(x, y) = [ \qquad (33)$$
$$p(x, y) \otimes g_{mk}(x, y)] + [g_{mk}(x, y) \otimes g_{mk}(x, y)]$$

Hence, the effectiveness of the embedding and detection of pattern $g_{mk}$ in typical images depends on the cross-correlation of the original image p with the chosen pattern $g_{mk}$ being of low magnitude and widely dispersed. This is difficult to estimate however, generally, the cross-correlation part is very small compared to the auto-correlation part. The heuristic argument for this is that LRHFs do not resemble features in typical images p. The LRHFs proposed have both wide spatial support and wide spectral support.

Consider the correlation between two LRHFs $g_{mk}(r)$ and $g_{nl}(r)$, being the second term in Equation (33). The Fourier transforms of the LRHFs $g_{mk}(r)$ and $g_{nl}(r)$ are of the form:

$$g_{mk}(r) = r^p r^{i\alpha_m} e^{ik\theta} \Leftrightarrow \mu_{mkp} q^{-p-2} q^{-i\alpha_m} e^{ik\phi} \qquad (34)$$

$$g_{nl}(r) = r^p r^{i\alpha_n} e^{il\theta} \Leftrightarrow \mu_{nlp} q^{-p-2} q^{-i\alpha_n} e^{il\phi} \qquad (35)$$

The product of the complex conjugate of the transform of LRHF $g_{mk}$ (r) and the transform of $g_{nl}(r)$, provides:

$$H_{mknl}(u,v) = \mu_{mkp} q^{-p-2} e^{+i\alpha_m} e^{-ik\phi}$$
$$\mu_{nlp} q^{-p-2} q^{-i\alpha_n} e^{il\phi} = \mu_{mkp} \mu_{nlp} q^{-2p-4}$$
$$q^{+i(\alpha_m - \alpha_n)} e^{i(l-k)\phi} \qquad (36)$$

The phases partly cancel when the two chosen LRHFs $g_{mk}(r)$ and $g_{nl}(r)$ are similar. Only when the functions are identical do the phases entirely cancel out. Phase cancellation is the classic condition for maximum correlation, although a purely linear phase component can exist and only indicates a shift in the two original functions.

In the case where the two LRHFs $g_{mk}(r)$ and $g_{nl}(r)$ are identical, Equation (36) reduces to:

$$H_{mkmk}(u,v) = (\mu_{mkp})^2 q^{-2p-4} \qquad (37)$$

In such a case the correlation peak will be of the form $$h_{mkmk}(x, y) \propto \begin{cases} \delta(x, y), & p = 2 \\ \pi - \ln(r), & p = 1 \\ r^{2p+2}, & p \neq 2, p \neq 1 \end{cases} \quad (38)$$

The above equations are ideals, and the correlation peaks will be finite and discrete approximations to the ideal in practice. The location of a correlation peak is a measurement of the relative displacement of two correlated patterns.

However, the pattern $g_{nl}(x,y)$ is typically limited to real values only when embedding in the discrete image $f(x,y)=p(x,y)+g_{nl}(x,y)$. The discrete image $f(x,y)$ is typically further limited by only 8 bits of data per pixel, thus greyscale levels 0-255. As noted earlier, all the preceding analysis extends easily to the case where a real pattern $\Leftrightarrow (g_{mk})$ is embedded in an image $p(x,y)$ and detected with a complex pattern $g_{nl}$. The main difference is a 2 times increase in the noise compared to the full complex correlation, or:

$$|\Re(g_{mk}) \otimes g_{nl}| \approx \frac{|g_{mk} \otimes g_{nl}|}{2} \quad (39)$$

Another difference is that the correlation of a pattern $g_{nl}$ with the real part of that pattern $g_{nl}$ is no longer a real power of r. Some oscillating structure will "leak" through, both radial and tangential.

The underlying mathematical method of LHRF correlation is invariant to any scale and rotation variation such that:

$$g(r,\theta) \otimes \aleph \{g(a.r,\theta+\phi)\} = [g(r,\theta) \otimes \aleph \{c.g(r,\theta)\}] \quad (40)$$

wherein $\aleph$ defines a real or imaginary component, r is a displacement distance, $\theta$ and $\phi$ are angles, a is a positive real number, and c is a complex number not dependent on said displacement distance r nor said angle $\theta$.

In a similar manner functions can be defined so that the correlation is invariant to any scale variation such that:

$$g(r,\theta) \otimes \aleph \{g(a.r,\theta)\} = [g(r,\theta) \otimes \aleph \{c.g(r,\theta)\}] \quad (41)$$

wherein c is a complex number not dependent on the displacement distance r or the angle $\theta$.

Further functions can be defined so that the correlation is invariant to any rotation variation such that:

$$g(r,\theta) \otimes \aleph \{g(r,\theta+\phi)\} = [g(r,\theta) \otimes \aleph \{c.g(r,\theta)\}] \quad (42)$$

wherein c is a complex number not dependent on said displacement distance r nor said angle $\theta$, and the function $g(r,\theta)$ does not necessarily have circular symmetry. In the case of circular asymmetry the relation $g(r,\theta) \neq g(r)$ holds. Many common functions and patterns with simple N-fold rotation symmetry are excluded from the above definition because they do not generally satisfy Equation (42) for all values of $\phi$; only for special values of the rotation angle $\phi = 2\pi/N$. An example of such a pattern is composed of three circles centred on the vertices of an equilateral triangle. Such a pattern has tri-fold rotational symmetry and repeats for rotation angles of $\phi = 2\pi/3$, and for all other angles Equation (42) is violated.

As noted before, the maximum frequency $q_{max}$ is kept below the Nyquist frequency of the discrete image. The maximum frequency $q_{max}$ is as defined in Equation (27), and determines the size of the 'hole' in the centre of the pattern. Similarly the size of the image introduces a maximum pattern size. In the simplest case, the pattern is restricted to an annular region defined by radii $R_1$ and $R_2$.

In addition to the conventional correlation process outlined above, and in particular Equations (36), (37) and (38), enhanced forms of correlation may also be usefully employed for the detection of embedded patterns.

One form of enhanced correlation is to boost the high frequency components of the conventional correlation. This has the effect of changing the real exponent p in Equations (37) and (38) resulting in a correlation peak which resembles the delta function in the second part of Equation (38).

Another form of enhanced correlation is known as "phase-only" correlation. Phase only correlation is implemented by taking the Fourier correlation magnitude, expressed in Equation (37) for example, and setting the correlation magnitude to unity. This ensures that only the phase terms contribute to the overall correlation peak. Again, the peak shape tends to resemble a delta function.

A variety of enhanced correlation processes, which consist of intermediates between frequency-boosted correlation and phase-only correlation, are also possible and applicable to the correlation detection.

Roughly speaking, the ratio of the two radii $R_1$ and $R_2$ in the annulus determine the extremes of the possible scale variations before correlations fail completely. Hence, the minimum scaling factor is $R_1/R_2$ and the maximum is $R_2/R_1$. Preferably, the limits are set at 50% overlap area between an embedded pattern $g_{km}$ and a detection pattern $g_{ln}$, in which case the two scaling ratios are:

$$\sqrt{\frac{1}{2}}\sqrt{1+\frac{1}{2l^2}} \quad (43)$$

and $$\sqrt{\frac{1}{2}}\sqrt{1+\frac{l^2}{2}}$$

where $$l = \frac{R_1}{R_2}$$

The range factor in this case is $$l\sqrt{\frac{2+l^2}{1+2l^2}} \quad (44)$$

In a typical case, for example, where l=4, then the ratios are 0.72 and 2.12.

From Equation (10), the width of the overlap integral (or, more precisely, the full-width-half-maximum) depends on the ratio of the maximum radius and the minimum radius of the annular region. Further, Equation (27) relates that the maximum frequency is an inverse of the minimum radius, is limited by the Nyquist frequency of the discrete image, and determines the size of the hole in the centre of the pattern.

Some portions of the description which follows are explicitly or implicitly presented in terms of algorithms and symbolic representations of operations on data within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated.

In the presence of noise, distortion and other imperfections, the accuracy of detection of an alignment mark or pattern is determined by the width of the overlap integral—in the ideal case, this would take the form of a delta function, with zero width. A mechanism to reduce the width of the overlap integral is to increase the maximum frequency contained in the alignment mark. One mechanism to achieve this is to decrease the size of the hole in the centre of the pattern, however this is impractical because the size of the hole is defined by the Nyquist frequency of the alignment mark rendering process.

In accordance with embodiments of the invention, a method of increasing the maximum frequency of the alignment mark is to combine the mark with a high frequency component (KFC). FIG. 1 illustrates a method 100 of increasing the maximum frequency of an alignment mark, in which step 1105 is the starting step and step 199 is the end of the process 100. In step 110, a LHRF basis function is generated using the processor 1205. The basis function may be stored in the memory 1225. In step 120, a basis pattern is generated by the processor 1205 from said basis function and is stored in memory 1225. An example of this operation is to use only the real part of the LHRF. Alternatively, only the imaginary part of the LHRF might be used. In step 130, a high frequency component 750 image is generated by the processor 1205. Step 130 may be performed in parallel with steps 110 and 120. Step 140 is a combining step, which combines the basis pattern and the high frequency component 750 using the processor 1205 to produce an alignment mark that can be rendered to a substrate. The alignment mark may be stored in the memory 1225 or HDD 1270.

The resultant alignment mark produced in method 100 is constrained by limitations in the process used to render or print the mark onto a substrate or surface. Examples of relevant printing processes include inkjet printers and electro photographic printers (commonly known as laser printers). In many printing processes, desired print density is typically much less than 50% due to dot gain, which is the effect whereby the printed dot appears larger than the apparent DPI of the printing process and results in the density of a printed section being higher than the apparent density of the ideal section. Another limitation imposed by the printing process is the allowed closeness of printed dots, caused by the risk of overheating of the print head in the case of an inkjet printer or similar method.

Figure 2:
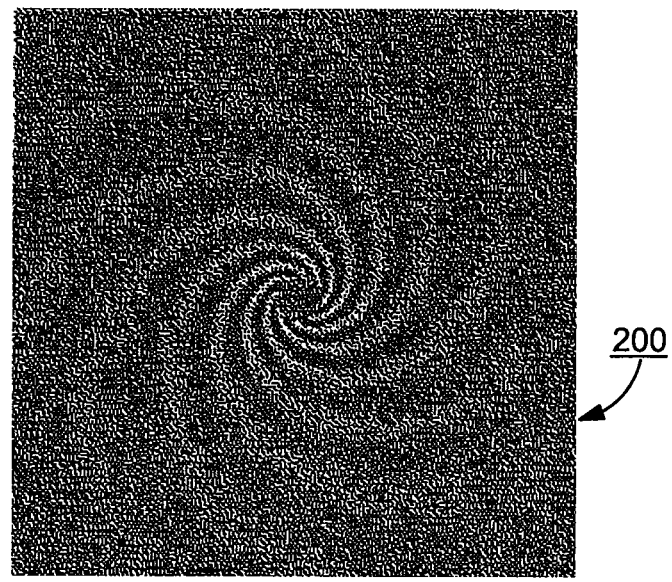
FIG. 2 is an image of a basis pattern, i.e. a rotation and scale invariant function.

FIG. 2 shows an example basis pattern 200. This pattern is the real part of a typical LRHF $g_{mk}$. In this example, the pixel values of the basis pattern 200 have values from −1 to 1.

FIG. 3 shows the pixel values 300 of a radial section of the basis pattern 200.

Figure 4:
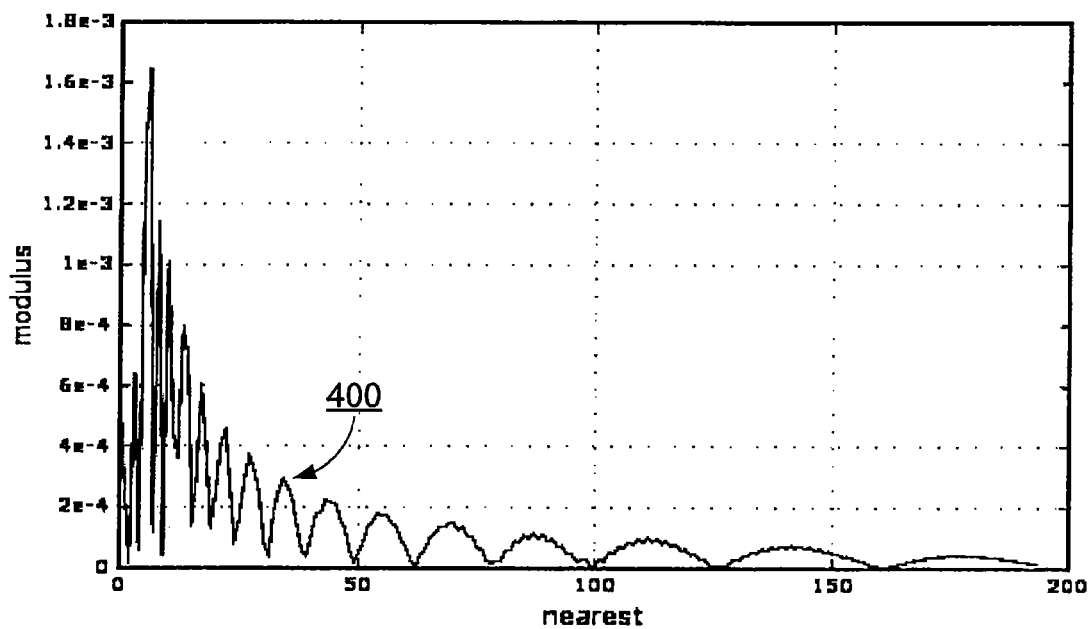
FIG. 4 is a plot of the Fourier transform of the function in FIG. 3.

FIG. 4 shows the Fourier transform 400 of the function 300 displayed in FIG. 3. The shape of this frequency response curve indicates the limited efficacy of attempting to decrease the minimum radius of the pattern: the amount of energy of the high-frequency part of the pattern is vanishingly small compared to the low-frequency response. That is, even if the printer can print a much reduced minimum radius, the benefit is reduced as the high-frequency information contributes weakly in the detection process.

Figure 5:
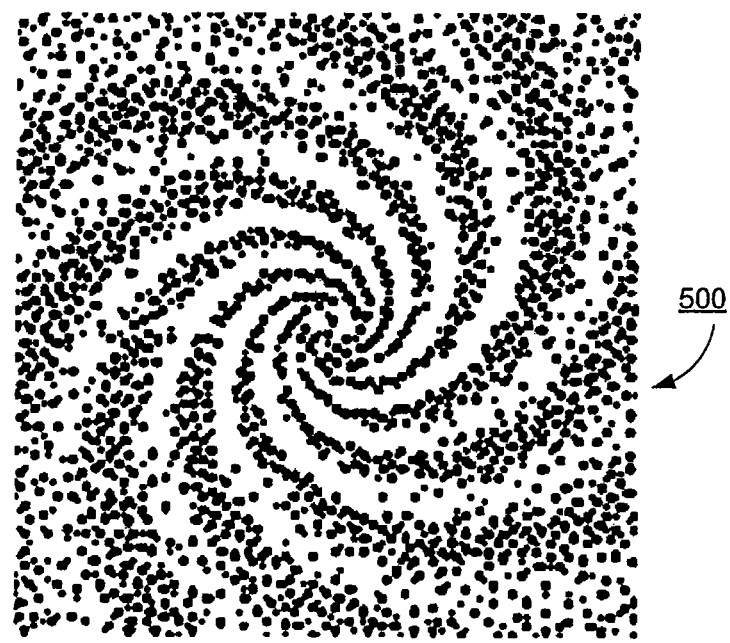
FIG. 5 is an image an alignment mark that is a scale invariant function combined with high frequency noise.

FIG. 5 is an example of an alignment mark 500 produced by the method 100 of FIG. 1. This alignment mark retains the low frequency properties of the basis pattern 200 of FIG. 2, particularly the rotation and scale invariance properties at low frequencies.

Figure 6:
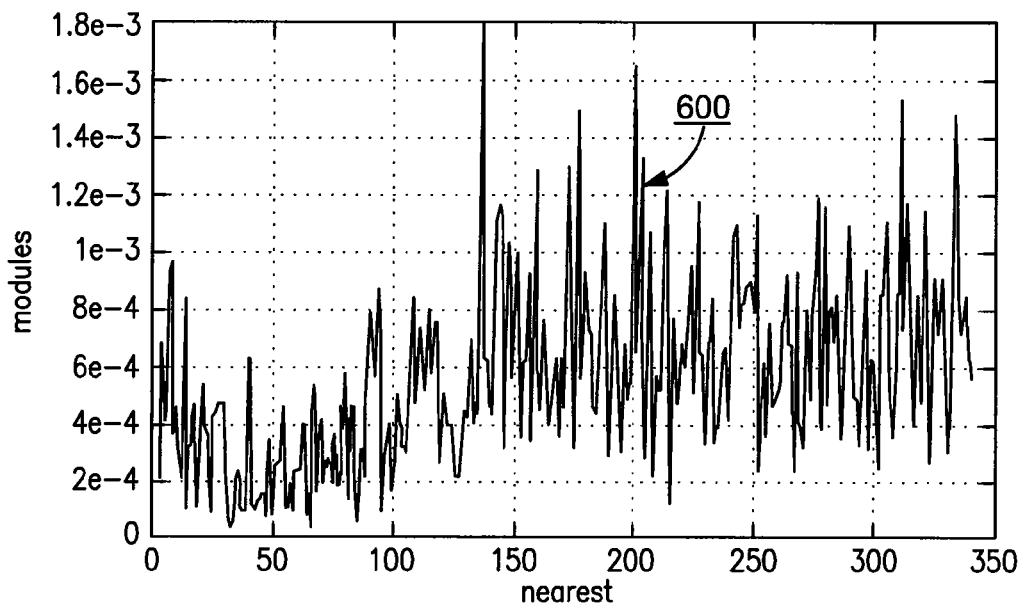
FIG. 6 is a plot of the Fourier transform of a section of the function in FIG. 5.

FIG. 6 shows the Fourier transform 600 of a section of the alignment mark 500, with strong energy at high frequencies. To benefit from this high frequency response of the pattern, initial detection of the basis pattern as above is performed, and from this initial detection the rotation and scale of the mark is estimated (as the high frequency information is not rotation and scale invariant). A second detection of the mark is performed by correlating the mark with the ideal theoretical mark at that scale and rotation. The rotation and scale of the mark (and the containing image) can be estimated through the use and detection of at least three identical alignment marks in nonlinear, non-symmetrical arrangement within the image. Alternatively, more than one unique alignment mark can be used on the substrate, so that each alignment mark can be separately detected. Once the constellation of alignment marks is detected through the rotation and scale invariant properties, an affine transform can be calculated and then applied to the ideal theoretical mark. The second detection and correlation step takes advantage of the boosted high frequency components of the mark and affords much higher detection accuracy than the first correlation.

Figure 7:
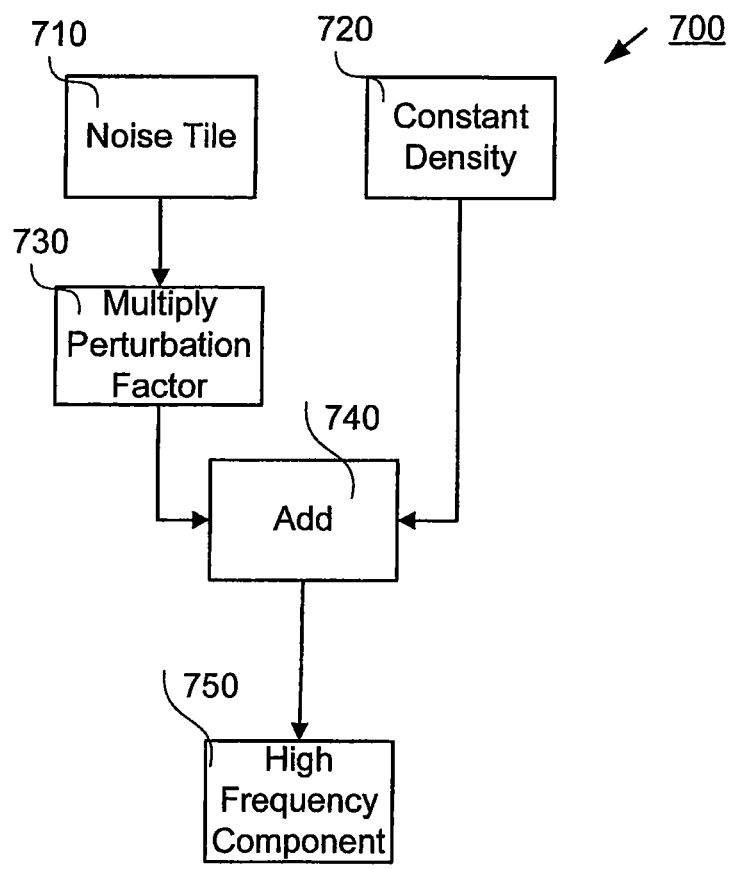
FIG. 7 is a flow diagram illustrating a method of generating a high frequency component as used in FIG. 1.

FIG. 7 illustrates a method 700 of producing the high frequency component 750 used in FIG. 1 (see step 130). In step 710, a uniformly distributed noise tile with values between −1.0 and 1.0 is created using the processor 1205 of FIG. 12, which is larger than the required size, for example of size 200×200 pixels. The noise tile may be stored in memory 1225. In step 720, a tile of the same size is created by the processor 1205 containing a constant density of values representing the desired density of the high frequency component 750, for example 0.15 for approximately 15% density in the high frequency component 750. Likewise, the constant density tile may be stored in memory 1225. In step 730, the tile created in step 710 is multiplied using the processor 1205 by a perturbation factor, for example 0.2, which governs the perturbation of the high frequency component 750 to prevent periodic patterns appearing. In step 740, the tiles from steps 720 and 730 are added together by the processor 1205 to create a perturbed high frequency component 750 with average density close to the desired 15%. The HFC may be stored in memory 1225.

Figure 8:
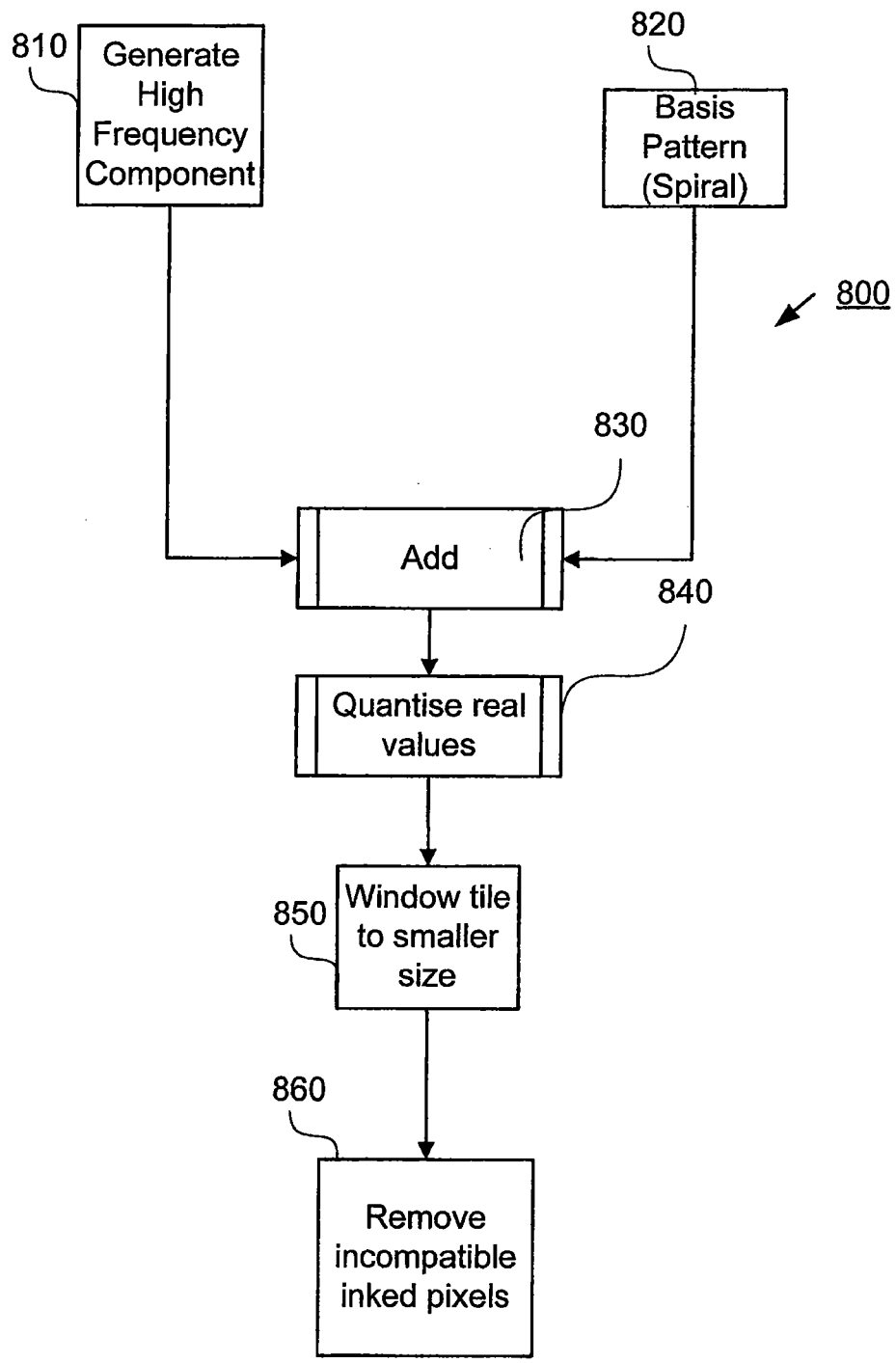
FIG. 8 is a schematic flow diagram illustrating a method of generating alignment marks according to a further embodiment of the invention.

FIG. 8 illustrates a method of generating an alignment mark, in which step 810 represents the method 700 outlined in FIG. 7. In step 810, the HFC is generated by the processor 1205 and may be stored in the memory 1225. In step 820, a basis pattern is input as per FIG. 2. The basis pattern may be stored in the memory 1225. Steps 830, 840, 850 and 860 together are an example of the combination step 140 of FIG. 1. In step 830, the high frequency component 750 and the basis pattern are added together by the processor 1205.

In step 840, the real values in the tile from step 830 are quantised by the processor 1205 to binary values of 0 or 1, with 0 representing inked pixels and 1 representing empty pixels. This is done using a half toning algorithm, for example an error diffusion algorithm. An example error diffusion algorithm is Floyd-Steinberg, which can be used to convert an image containing specified grey levels into discrete dots of the same local average density as the original grey level image.

Unfortunately for the purposes of generating a mark with good correlation characteristics, the Floyd-Steinberg algorithm can generate images containing periodic structures, which do not have good spread-spectrum characteristics for image correlation. To ensure that the dots in the alignment mark have good correlation characteristics, the high frequency component 750 is constructed from random noise 730 added in step 740 to a constant density image 720 to perturb the placement of quantized dots.

The Floyd-Steinberg algorithm also suffers from low density in the top left of a generated image where error values have not accumulated to the extent of producing any inked dots, so in step 710 a larger image than required is generated. In step 850, the tile is effectively windowed to a smaller size, e.g. 144×144, using the processor 1205. The low density region in the top left of the image is cropped out.

Due to the non-deterministic nature of these methods, some small number of dots may be created, which are not compatible with the method used to render the alignment mark onto the target substrate. These dots can be removed in another pass over the image without substantially affecting the density of the mark. In step 860, the tile from step 850 is processed by the processor 1205 to remove inked pixels that are incompatible with the alignment mark printing mechanism, for example removing an inked pixel if any of its neighbours are also inked (printed) pixels. Thus, the tile is prepared for printing as an alignment mark. The tile may be stored in the memory 1225.

Figure 9:
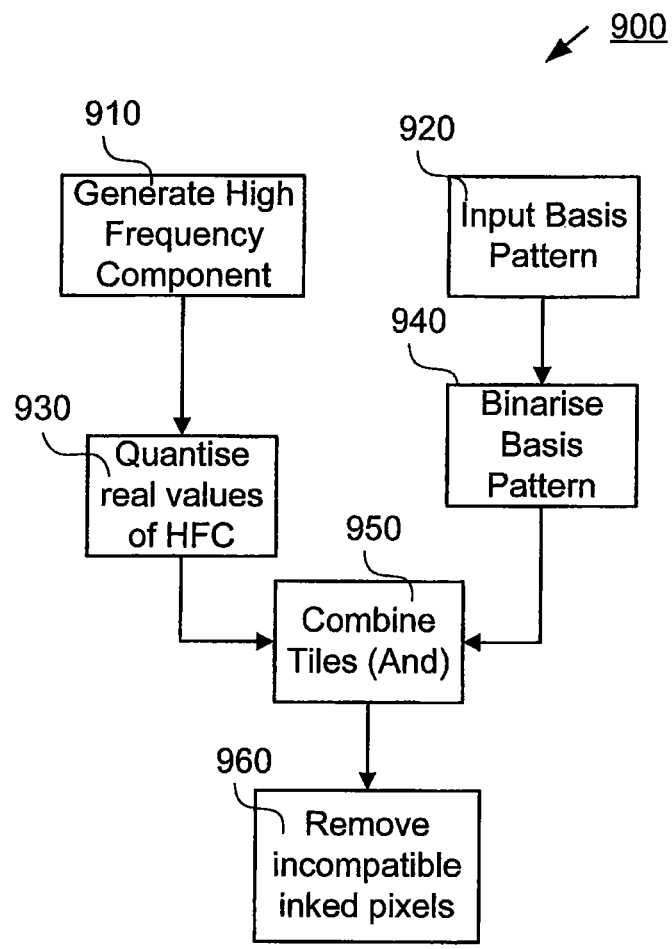
FIG. 9 is a schematic flow diagram illustrating a method of generating alignment marks according to another embodiment of the invention.

FIG. 9 illustrates a method 900 of generating alignment marks according to another embodiment of the invention. In step 910, a HFC is generated by the processor 1205 and may be stored in the memory 1225. The step 910 represents the method 700 of FIG. 7, except that a high frequency component 750 of twice the density of the desired output alignment mark is produced. If the alignment mark has a desired output density of 15%, the high frequency component 750 is constructed with a density of 30% in step 910. Step 940 removes approximately half of the high frequency component 750 printed pixels. In step 920, a basis pattern is input as per FIG. 2. Steps 930, 940, 950 and 960 together are an example of the combination step 140. In step 930, the real values in the high frequency component 750 tile from step 910 are quantised by the processor 1205 using a half toning algorithm (e.g. an error diffusion algorithm) to binary values of 0 or 1, with 0 representing inked pixels and 1 representing empty pixels. In step 940, the basis pattern is binarised by the processor 1205. The basis pattern is subjected to a binarise operation, whereby any basis pattern pixels with a value 0 or less are set to a value of 0, and any basis pattern pixels with a value more than 0 are set to a value of 1. The resulting tile from step 940 has a density of approximately 50%. In step 950, the tiles of steps 930 and 940 are combined by the processor 1205 using a logical And operation, such that a pixel is set to a value of 1 if the corresponding pixels in both input tiles have a value of 1. Otherwise, the pixel is set to value 0. In step 960, the tile from step 950 is processed by the processor 1205 to remove inked pixels which are incompatible with the alignment mark printing mechanism, for example removing an inked pixel if any of that pixel's neighbours are also inked pixels. The tile is prepared for printing as an alignment mark. The tile may be stored in the memory 1225.

Figure 10:
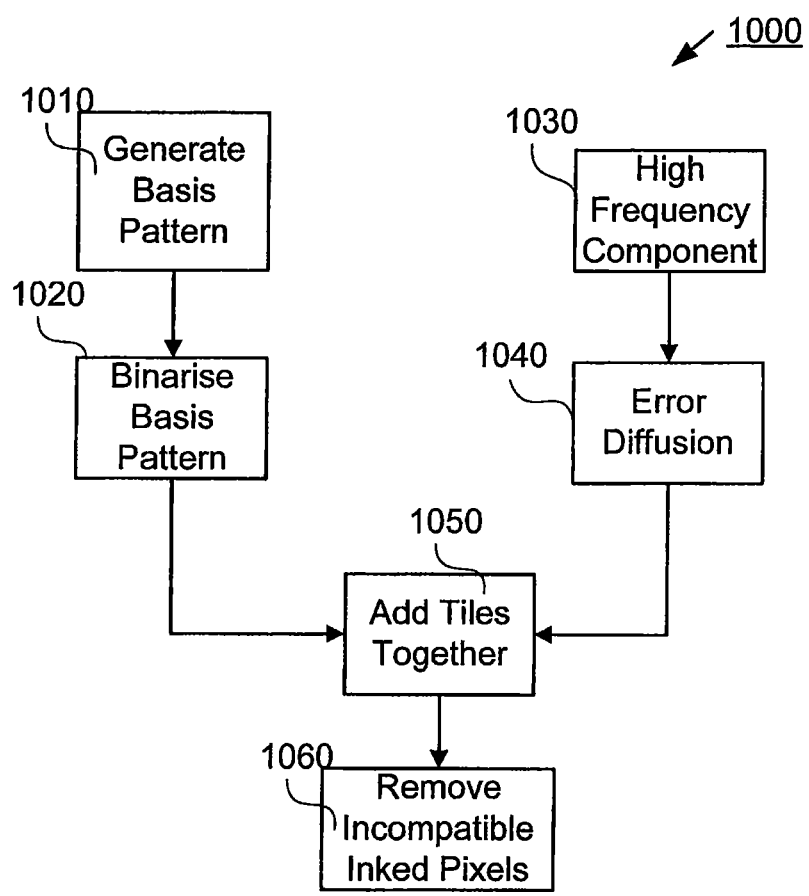
FIG. 10 is a schematic flow diagram illustrating a method of generating alignment marks according to yet a further embodiment of the invention.

FIG. 10 illustrates a method 1000 of generating alignment marks in accordance with yet another embodiment of the invention. In step 1010, a basis pattern as per FIG. 2 is generated by the processor 1205, where the hole in the centre of the basis pattern is large enough to contain a pseudo-random noise tile with sufficient energy for accurate detection by correlation. In step 1020, the basis pattern is binarised by the processor 1205 by being subjected to a binarise operation. Any basis pattern pixels with a value 0 or less are set to a value of 0, and any basis pattern pixels with a value more than 0 are set to a value of 1. Step 1030 represents the method 700 of FIG. 7, and therefore the processor 1205 produces a high frequency component 750. In step 1040, the real values in the high frequency component 750 tile from step 1030 are binarised by the processor 1205 to binary values of 0 or 1, with 0 representing inked pixels and 1 representing empty pixels. This is done using a half toning algorithm (e.g. an error diffusion algorithm). In step 1050, the tiles of steps 1020 and 1040 are added together by the processor 1205 such that the value of each pixel in the output tile is equal to the value of the corresponding pixel in the tile of step 1020, except for pixels corresponding to the hole in the centre of the basis pattern, in which case the output pixel is equal to the value of the corresponding pixel in the tile of step 1040. In step 1060, the tile from step 1050 is processed by the processor 1205 to remove inked pixels that are incompatible with the alignment mark rendering mechanism, for example removing an inked pixel if any neighbouring pixel is also inked. That is, the tile is prepared for printing. The tile may be stored in the memory 1225.

A Sample Application

An example application of a alignment mark produced in accordance with one of the embodiments of the invention is the measurement of linefeed of an inkjet printer. FIG. 11 illustrates an arrangement 1100 for measuring the linefeed of an inkjet printer 1120 using a general-purpose computer 1110 and a digital scanner 1130. The printer 1120 and the scanner 1130 are coupled to the computer 1110.

Figure 13:
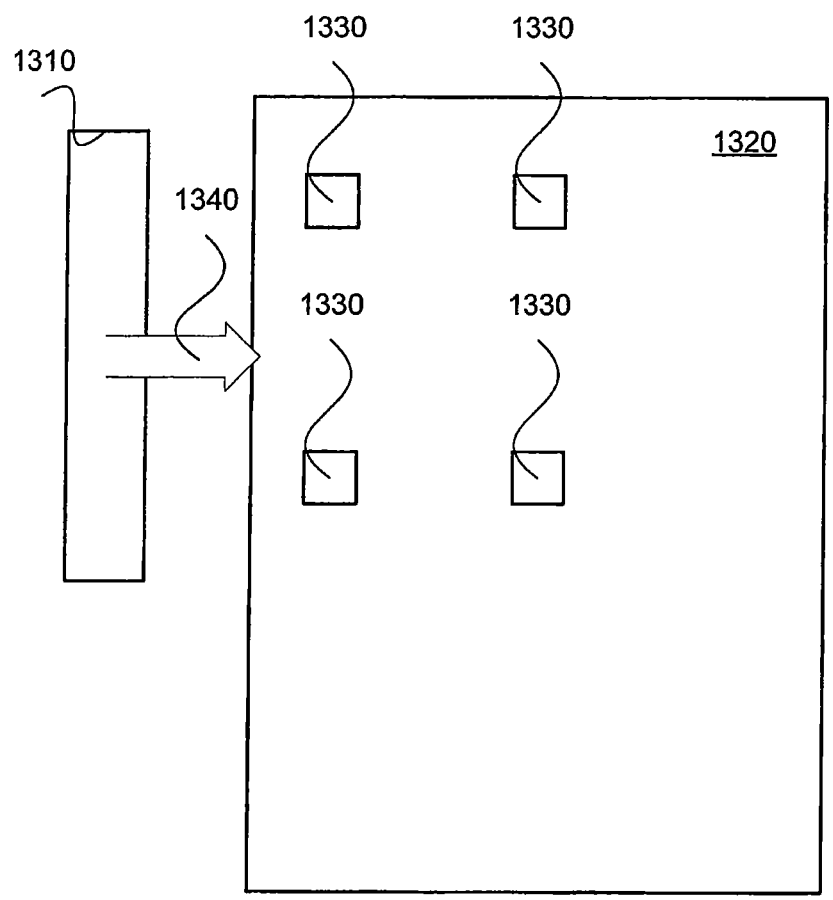
FIGS. 13 and 14 are block diagrams illustrating the printing process for a chart which can be used to measure characteristics of the print medium feed mechanism of an inkjet printer.
Figure 14:
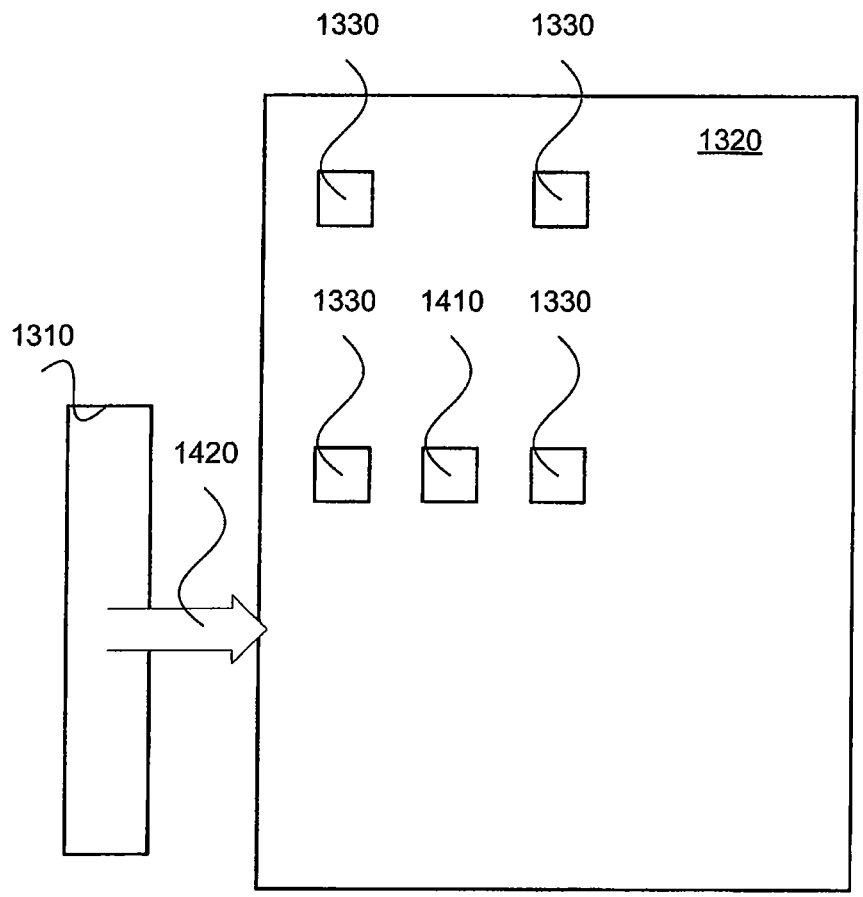

FIGS. 13 and 14 illustrate the printing process for a chart that can be used to measure characteristics of the print medium feed mechanism (not shown) of an inkjet printer 1120. The print head 1310 makes a forward passage 1340 across the print medium 1320 (from left to right in FIG. 13) and records or prints alignment marks 1330 in accordance with an embodiment of the invention. For ease of representation only, the alignment marks 1330 are represented by rectangles, but resemble the previously defined alignment mark 500 shown in FIG. 5. The print medium feed mechanism moves the print medium 1320 and a second forward passage 1420 of the print head 1310 shown in FIG. 14 records at least one further alignment mark 1410.

According to this printing method, the displacement in the print medium feed direction between marks 1330, 1410 printed on consecutive passages 1340, 1420 of the print head 1310 connotes the distance the feed mechanism transported the print medium 1320. Multiple marks may be recorded in the print head scan direction to make multiple measurements or to characterise the mechanism across the print medium 1320. Alignment marks 1330, 1410 may be printed using different nozzles within the nozzle groups such that after the print medium 1320 is fed the alignment marks are approximately aligned or otherwise laid out for optimal chart density analysis accuracy. Multiple alignment marks may be recorded in the print medium feed direction to provide optimal layout for measuring the previous movement of the print medium feed mechanism and the following movement.

The print medium 1320 of FIGS. 13 and 14 is imaged by the digital scanner 1130 or any similar device, such as a digital camera or optical sensor mounted within the printer, of FIG. 11 to capture information on the brightness of the chart in two dimensions. Additional operations may be performed on the imaged chart to reduce or remove artefacts and imperfections in the image process. Low pass filtering and downsampling the image are examples of operations that are beneficial in reducing the effects of spatial aliasing in the imaging process.

Figure 15:
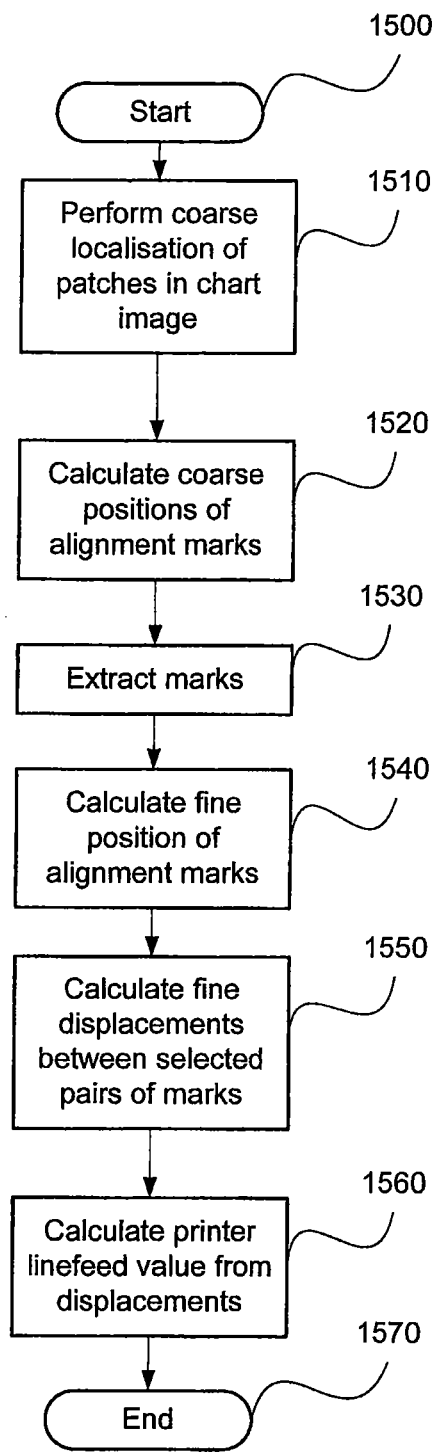
FIG. 15 is a flowchart illustrating a method of analysing the imaged chart to measure the printer linefeed.

FIG. 15 illustrates a method 1500 of analysing the imaged chart to measure the printer linefeed. Step 1500 is the starting state, in which the imaged chart is loaded into computer memory 1225. In step 1510, coarse localisation of patches in the chart image is performed by the processor 1205. The imaged chart is correlated against the LHRF 200. The result peaks at the approximate locations of the alignment marks 1330 and 1410 on the imaged chart. In step 1520, the coarse positions of registration or alignment marks are calculated by the processor 1205. The location of the aforementioned peaks are determined, and an affine transform of the peaks is calculated against the expected constellation of tile locations. In step 1530, the registration or alignment marks are extracted by the processor 1205. The affine transform is used to extract areas from the imaged chart corresponding to each registration mark with a border region around each mark. In step 1540, the fine positions of registration marks are calculated by the processor 1205. The affine transform is applied to the ideal alignment mark 500, and then the transformed ideal alignment mark is correlated against each extracted mark, to determine the fine position of each alignment mark. In step 1550, the fine displacements between selected pairs of marks are calculated by the processor 1205. The fine position of each alignment mark is used to calculate relative displacements of the alignment marks. In step 1560, from these displacements 15 the printer linefeed value is calculated by the processor 1205. The value is available for further analysis or calibration of the printer at the end of the analysis 1570 and may be stored in memory 1225.

Figure 16:
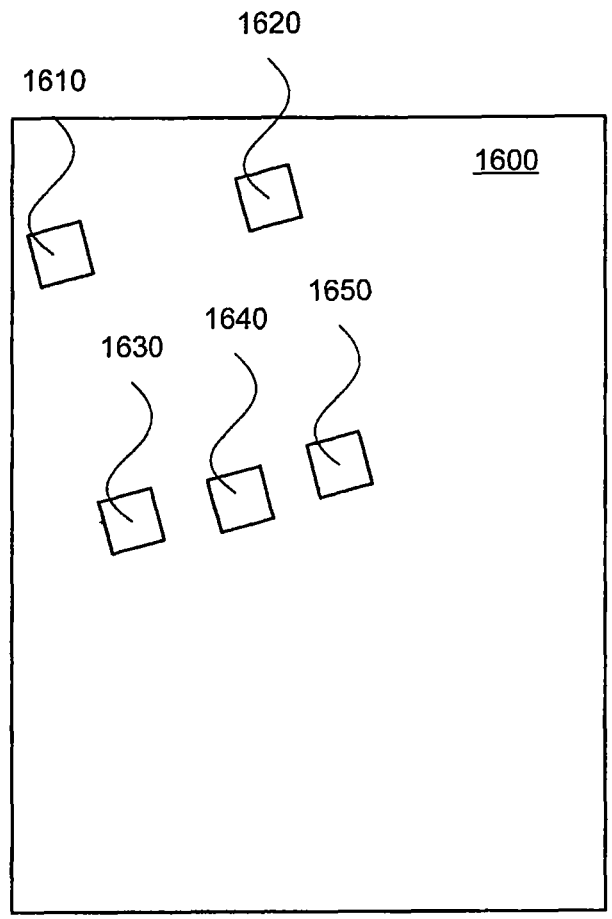
FIG. 16 is a block diagram showing an example of an imaged chart.

FIG. 16 shows an example of an imaged or scanned chart 1600 obtained from the printed image 1320 of FIG. 13. The imaged alignment marks are represented by blocks labelled 1610 to 1650. In step 1560 of FIG. 15, the displacements of marks 1610 to 1630 and 1620 to 1650 can be compared to the known separation of the printed marks to accurately measure the scale of the imaged chart 1600. The distance of mark 1640 from a line from 1630 to 1650 gives the difference of the linefeed compared to the known separation of 1620 to 1650. This method can be used to minimise the effect of scanner distortion on the linefeed measurement.

Methods, apparatuses, systems and computer program products have been disclosed for generating alignment marks. Methods, apparatuses, systems and computer program products have also been disclosed for printing a chart for measuring characteristics of a print medium feed mechanism of a printer. Still further, methods, apparatuses, systems and computer program products have been disclosed for measuring the linefeed characteristic of a printer. The embodiments of the invention are applicable to the computer and data processing industries, amongst others. The foregoing describes only some embodiments of the present invention, and modifications and/or changes can be made thereto without departing from the scope and spirit of the invention, the embodiments being illustrative and not restrictive.

The claims defining the invention are as follows:

1. A computer-implemented method for generating an alignment mark using a processor and a memory coupled to said processor, said method comprising the steps of:
   combining a basis pattern and a high frequency component, said basis pattern being defined such that a scaled and rotated version of said basis pattern correlated with said basis pattern is substantially equal to the auto-correlation of said basis pattern within a complex multiplicative constant, said high frequency component being of sufficient energy for cross correlation without detriment to said basis pattern; and
   outputting to at least one of said memory and a printer said combination as at least one alignment mark having an increased maximum frequency.

2. The method according to claim 1, wherein said basis pattern is a tile comprising a plurality of pixels, and said high frequency component is a tile comprising a plurality of pixels.

3. The method according to claim 1, further comprising printing said at least one alignment mark on a print medium.

4. The method according to claim 1, further comprising the steps of:
   generating a basis function; and
   generating said basis pattern from said basis function.

5. The method according to claim 4, wherein said basis function is a logarithmic radial harmonic function (LRHF).

6. The method according to claim 5, wherein said basis pattern is generated by using only the real part or only the imaginary part of said LRHF.

7. The method according to claim 1, further comprising the step of generating said high frequency component.

8. The method according to claim 7, wherein said generating step comprises:
   creating a tile comprising a plurality of pixels having uniformly distributed noise values without periodic patterns; and
   creating a tile comprising a plurality of pixels having a constant density of values for a desired density of said high frequency component.

9. The method according to claim 8, wherein said tile having uniformly distributed noise values without periodic patterns is created by multiplying a perturbation factor a tile comprising a plurality of pixels having uniformly distributed noise values to provide said tile having uniformly distributed noise values without periodic patterns having an average density close to said desired density of said high frequency component.

10. The method according to claim 1, wherein said combining step comprises:
    adding said basis pattern and said high frequency component together, each being a tile comprising a plurality of pixels arranged in two dimensions; and
    quantising values of the addition tile resulting from said adding step to provide binary values, each binary value indicating if a pixel is to be rendered with a colourant or if said pixel is empty.

11. The method according to claim 1, wherein said combining step comprises:
    quantising real values of said high frequency component, said high frequency component being a tile comprising a plurality of pixels arranged in two dimensions;
    quantising values of said basis pattern to provide binary values; and
    using a logical AND operation to combine said quantised high frequency component and said quantised basis pattern.

12. The method according to claim 7, wherein said combining step further comprises removing at least one quantised value of a pixel from the tile of quantised values, said removed value of said pixel being incompatible with rendering of said at least one alignment mark onto a print medium.

13. The method according to claim 7, wherein said quantising step uses a halftoning algorithm.

14. The method according to claim 1, further comprising the step of applying a pseudo-random mask to a basis function to provide said basis pattern.

15. The method according to claim 1, further comprising the steps of
    printing on a print medium in a first passage across said print medium at least two alignment marks, each alignment mark printed in said first passage generated using said combining and outputting steps;
    displacing said print medium in a feed direction using a print medium feed mechanism of a printer; and printing on a print medium in a second passage across said print medium at least one alignment mark, each alignment mark printed in said second passage generated using said combining and outputting steps, said printing steps and said displacing step printing a chart for measuring characteristics of said print medium feed mechanism of said printer.

16. The method according to claim 15, further comprising the steps of
imaging a chart printed using said printer using the printing steps and displacing steps;
calculating locations of said alignment marks in said image of said printed chart;
calculating relative displacements between pairs of said alignment marks in said image of said printed chart; and
calculating the linefeed characteristic of said printer dependent upon said calculated relative displacements to measure the linefeed characteristic of the printer.

17. An apparatus for generating an alignment mark, comprising:
a memory for storing data and instructions for a central processing unit; and
a central processing unit coupled to said memory, said central processing unit and said memory configured using said instructions and said data to generate said alignment marks, said instructions for performing the operations of:
combining a basis pattern and a high frequency component, said basis pattern being defined such that a scaled and rotated version of said basis pattern correlated with said basis pattern is substantially equal to the auto-correlation of said basis pattern within a complex multiplicative constant, said high frequency component being of sufficient energy for cross correlation without detriment to said basis pattern; and
outputting to at least one of said memory and a printer said combination as at least one alignment mark having an increased maximum frequency.

18. The apparatus according to claim 17, further comprising:
at least one print head for printing on a print medium;
a print medium feed mechanism for displacing said print medium, said central processing unit, said memory, said at least one print head, and said print medium feed mechanism configured and operated to measure characteristics of a printing apparatus.

19. The apparatus according to claim 17, further comprising:
an imaging device for generating an image of said printed chart;
means for calculating locations of alignment marks in said image of said printed chart;
means for calculating relative displacements between pairs of said alignment marks in said image of said printed chart; and
means for calculating the linefeed characteristic of said printer dependent upon said calculated relative displacements.

20. A computer program product comprising a tangible computer readable medium having a computer program recorded thereon for execution by a computer to generate an alignment mark, said computer program product comprising
computer program code means for combining a basis pattern and a high frequency component, said basis pattern being defined such that a scaled and rotated version of said basis pattern correlated with said basis pattern is substantially equal to the auto-correlation of said basis pattern within a complex multiplicative constant, said high frequency component being of sufficient energy for cross correlation without detriment to said basis pattern; and
computer program code means for outputting to at least one of a memory and a printer said combination as at least one alignment mark having an increased maximum frequency.

* * * * *